(12) United States Patent  
Sekiguchi et al.

(10) Patent No.: US 8,952,372 B2  
(45) Date of Patent: Feb. 10, 2015

(54) PHOTOELECTRIC ELEMENT AND METHOD FOR PRODUCING THE SAME

(71) Applicants: Panasonic Corporation, Osaka (JP); Waseda University, Tokyo (JP)

(72) Inventors: Takashi Sekiguchi, Osaka (JP); Michio Suzuka, Osaka (JP); Naoki Hayashi, Kyoto (JP); Takeyuki Yamaki, Nara (JP); Hiroyuki Nishide, Tokyo (JP); Kenichi Oyaizu, Tokyo (JP); Fumiaki Kato, Tokyo (JP); Naoki Sano, Tokyo (JP)

(73) Assignees: Panasonic Corporation, Osakak (JP); Waseda University, Tokyo (JP)

( * ) Notice: Subject to any disclaimer, the term of this patent is extended or adjusted under 35 U.S.C. 154(b) by 0 days.

(21) Appl. No.: 14/007,800

(22) PCT Filed: Dec. 12, 2012

(86) PCT No.: PCT/JP2012/082235  
§ 371 (c)(1),  
(2) Date: Sep. 26, 2013

(87) PCT Pub. No.: WO2013/099614  
PCT Pub. Date: Jul. 4, 2013

(65) Prior Publication Data  
US 2014/0124757 A1 May 8, 2014

(30) Foreign Application Priority Data  
Dec. 28, 2011 (JP) ................... 2011-287221

(51) Int. Cl.  
*H01L 29/08* (2006.01)  
*H01L 35/24* (2006.01)  
(Continued)

(52) U.S. Cl.  
CPC .......... *H01L 51/0067* (2013.01); *H01G 9/2059* (2013.01); *H01L 51/004* (2013.01); *Y02E 10/549* (2013.01); *H01L 51/0006* (2013.01); *H01L 2251/306* (2013.01)  
USPC ........................................ 257/40

(58) Field of Classification Search  
USPC ............... 136/256; 257/40, 43, E33.059, 257/642–643, 759, E51.001–E51.052, 257/E25.008–E25.009, E39.007, 257/E27.117–E27.119, 13, 79–103, 918, 257/E51.018–E51.022, E33.077, E33.054, 257/E25.028, E25.032; 438/22–47, 69, 438/493, 503, 507, 956, 610, 623, 780, 789, 438/790, 793, 794, 82, 99  
See application file for complete search history.

(56) References Cited

U.S. PATENT DOCUMENTS

| 4,927,721 A | 5/1990 | Gratzel et al. |
| 5,084,365 A | 1/1992 | Gratzel et al. |

(Continued)

FOREIGN PATENT DOCUMENTS

| EP | 0 718 288 B2 | 6/2005 |
| JP | 1-220380 | 9/1989 |

(Continued)

OTHER PUBLICATIONS

International Search Report for corresponding International Application No. PCT/JP2012/082235 dated Mar. 5, 2013.

(Continued)

*Primary Examiner* — Dao H Nguyen  
*Assistant Examiner* — Tram H Nguyen  
(74) *Attorney, Agent, or Firm* — Renner, Otto, Boisselle & Sklar, LLP (57) ABSTRACT

To provide a photoelectric element A including a first electrode 2, a second electrode 3 arranged opposite to the first electrode 2, an electron transport layer 1 provided on a face of the first electrode 2, the face being opposite to the second electrode 3, a photosensitizer 5 supported on the electron transport layer 1, and a hole transport layer 4 interposed between the first electrode 2 and the second electrode 3. The electron transport layer 1 includes a filled part 8 containing an organic molecule.

10 Claims, 2 Drawing Sheets

(51) Int. Cl.
*H01L 51/00* (2006.01)
*H01G 9/20* (2006.01)

(56) References Cited

U.S. PATENT DOCUMENTS

| | | | |
|---|---|---|---|
| 5,683,832 | A | 11/1997 | Bonhote et al. |
| 5,728,487 | A | 3/1998 | Gratzel et al. |
| 6,423,429 | B2 * | 7/2002 | Kido et al. ............ 428/690 |
| 2008/0078443 | A1 | 4/2008 | Jun et al. |
| 2012/0119193 | A1 | 5/2012 | Sekiguchi et al. |
| 2012/0181516 | A1 | 7/2012 | Sekiguchi et al. |
| 2012/0187387 | A1 * | 7/2012 | Sekiguchi et al. ........ 257/40 |
| 2013/0199614 | A1 * | 8/2013 | Suzuka et al. .......... 136/263 |

FOREIGN PATENT DOCUMENTS

| | | |
|---|---|---|
| JP | 2664194 B2 | 6/1997 |
| JP | 2003-243054 | 8/2003 |
| JP | 2004-119555 | 4/2004 |
| JP | 2006-210102 | 8/2006 |
| JP | 2008-091339 | 4/2008 |
| JP | 2008-159334 | 7/2008 |
| JP | 2009-187844 | 8/2009 |
| JP | 2011-006665 | 1/2011 |
| JP | 2011-023344 A | 2/2011 |
| JP | 2011-034813 | 2/2011 |
| JP | 2011-023344 * | 3/2011 |
| JP | 2011-124567 A | 6/2011 |
| JP | 2012-114063 A | 6/2012 |
| WO | WO 95/18456 A1 | 7/1995 |
| WO | WO 2010/024090 A1 | 3/2010 |

OTHER PUBLICATIONS

Form PCT/ISA/237 for corresponding International Application No. PCT/JP2012/082235 dated Mar. 5, 2013.

"The recent development of the polymer solid electrolyte", *Denki Kagaku (Electrochemistry)*, vol. 65, No. 11, p. 923 (1997) and English Abstract (cited in the specification).

Papageorgiou et al., "The Performance and Stability of Ambient Temperature Molten Salts for Solar Cell Applications", J. Electrochem. Soc., vol. 143, No. 10, p. 3099-3108 (1996) (cited in the specification).

Bonhôte et al., "Hydrophobic, Highly Conductive Ambient-Temperature Molten Salts", Inorg. Chem., vol. 35, p. 1168-1178 (1996) (cited in the specification).

* cited by examiner

PHOTOELECTRIC ELEMENT AND METHOD FOR PRODUCING THE SAME

TECHNICAL FIELD

The present invention relates to a photoelectric element converting light into electricity or electricity into light and a method for producing the photoelectric element.

BACKGROUND ART

In recent years, photoelectric elements have been used as, for example, power generation devices by photoelectric conversion, such as a photovoltaic cell and a solar cell, light-emitting devices such as an organic EL device, optical display devices such as an electrochromic display device and electronic paper, and sensor devices sensing, for example, temperature and light. Among them, a pn-junction device has been put into practice as a photoelectric element such as a solar cell. In addition, various photoelectric elements have been studied based on photoelectrochemistry as disclosed in Japanese Patent Publication No. 2664194 (hereinafter called literature 1) and other literatures. The photoelectric element is produced by interposing a charge transport layer such as an electrolyte between a first electrode with a semiconductor and a second electrode. The semiconductor typically supports a dye as a photosensitizer, and the photoelectric element is accordingly used as a dye-sensitized solar cell. Applying light to the semiconductor causes the semiconductor to generate charges; the charges move through the charge transport layer; and electricity can be extracted to the outside through the first electrode with the semiconductor as the negative electrode and through the second electrode as the positive electrode.

Although such a photoelectric element is formed so that charges generated from the semiconductor move through the charge transport layer as described above, the photoelectric element has insufficient conversion efficiency from light applied to the semiconductor to electricity extracted to the outside.

SUMMARY OF THE INVENTION

In view of the above circumstances, the present invention has an object to provide a photoelectric element having excellent conversion efficiency and a method for producing the photoelectric element.

The present invention is a photoelectric element including a first electrode, a second electrode arranged opposite to the first electrode, an electron transport layer provided on a face of the first electrode, the face being opposite to the second electrode, a photosensitizer supported on the electron transport layer, and a hole transport layer interposed between the first electrode and the second electrode. The electron transport layer includes a filled part containing an organic molecule.

In the photoelectric element of the present invention, it is preferable that the electron transport layer have a cavity penetrating in the thickness direction of the electron transport layer and the filled part be arranged in the cavity.

In the photoelectric element of the present invention, it is preferable that the organic molecule contain a molecule obtained by electropolymerization of a precursor having two or more moieties represented by [Chemical Formula 1] per molecule.

[Chemical Formula 1]

X is an electropolymerizable functional group representing any of a cyano group, a fluoro group, a chloro group, and a bromo group.

In the photoelectric element of the present invention, it is preferable that the precursor have two moieties represented by [Chemical Formula 1] and the organic molecule be a straight-chain polymer.

In the photoelectric element of the present invention, it is preferable that the organic molecule be a polymer having a repeating unit of [Chemical Formula 2] or [Chemical Formula 3].

[Chemical Formula 2]

[Chemical Formula 3]

In the photoelectric element of the present invention, it is preferable that the precursor have three or more moieties represented by [Chemical Formula 1] and the organic molecule be a cross-linked polymer.

In the photoelectric element of the present invention, it is preferable that the organic molecule be a polymer having a repeating unit of [Chemical Formula 4].

[Chemical Formula 4]

In the photoelectric element of the present invention, it is preferable that the precursor have at least one counter anion selected from the group consisting of a bromide ion, a chloride ion, a perchlorate ion, a hexafluorophosphate ion, and a tetrafluoroborate ion.

The present invention is a method for producing a photoelectric element including a first electrode, a second electrode arranged opposite to the first electrode, an electron transport layer provided on a face of the first electrode, the face being opposite to the second electrode, a photosensitizer supported on the electron transport layer, and a hole transport layer interposed between the first electrode and the second electrode. The method includes immersing the first electrode with the electron transport layer in a liquid containing a precursor, and applying an electric potential lower than a reduction potential of the precursor to the first electrode to precipitate an organic molecule as a film on a surface of the first electrode. This allows the electron transport layer to include the organic molecule as a filled part.

The present invention blocks paths, through which mediator diffuses, present in the electron transport layer to thus suppress the reduction in an open circuit voltage, thereby achieving excellent conversion efficiency.

DESCRIPTION OF EMBODIMENTS

Embodiments for carrying out the present invention will be described hereinafter. Conventional techniques before the present invention will be described first, and embodiments of the present invention will next be described.

Figure 4:
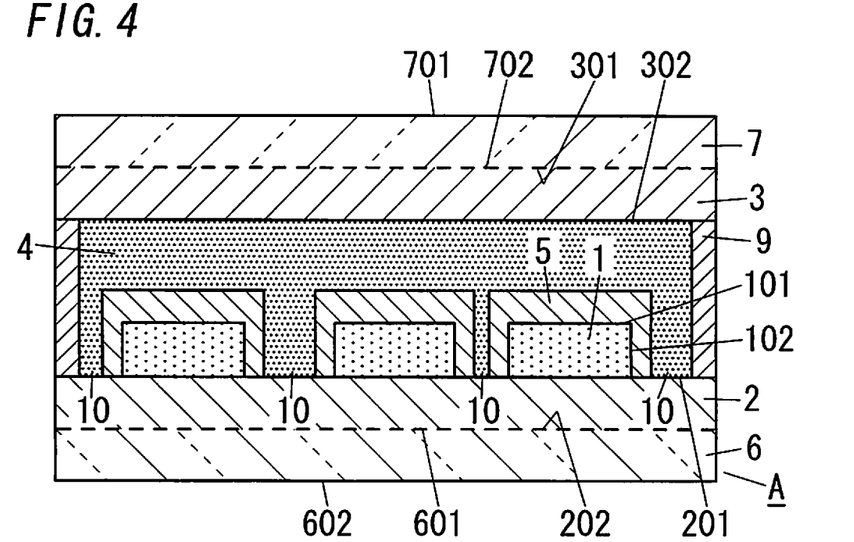
FIG. 4 is a schematic view showing an example of a conventional photoelectric element before the present invention.

FIG. 4 shows an example of a conventional photoelectric element (for example, a dye-sensitized solar cell) before the present invention. In the photoelectric element A, a first electrode 2 and a second electrode 3 are arranged opposite to and spaced a predetermined distance apart from each other. The space between the first electrode 2 and the second electrode 3 is sealed with a sealing member 9 and the sealed space is filled with an electrolytic solution as a hole transport layer 4. The first electrode 2 has a face that is opposite to the second electrode 3 and on which an electron transport layer 1 is stacked. The electron transport layer 1 has a face that is opposite to the second electrode 3 and on which a dye as a photosensitizer 5 is stacked as a layer.

The electron transport layer 1 includes hole-like or slit-like cavities 10 penetrating in the thickness direction. The reason for the generation of the cavities 10 is mainly considered as below. The electron transport layer 1 is formed by applying and drying a solution containing an electron transport material and the process makes the whole electron transport layer 1 difficult to have a homogeneous structure. Although some of the photosensitizer 5 penetrates the cavities 10, the cavities 10 are not completely filled with the photosensitizer 5. Thus, the cavities 10 are filled with the electrolytic solution as the hole transport layer 4, and the first electrode 2 accordingly comes in direct contact with the hole transport layer 4.

Figure 5:
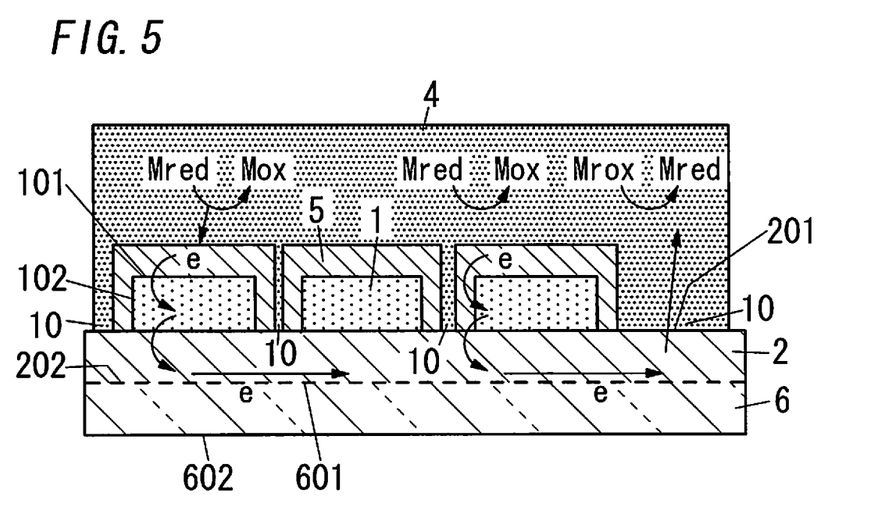
FIG. 5 is a schematic view showing an exemplified movement in a conventional photoelectric element before the present invention.

In such a photoelectric element A, the reaction of a mediator in the hole transport layer 4 is shown by Mox+e$\leftrightarrow$Mred. Here, "Mox" is an oxidized form, "e" is an electron, "Mred" is a reduced form, and "$\leftrightarrow$" is an oxidation-reduction reaction. In the photoelectric element A, a desired reaction is as shown in FIG. 5 in which reduction of Mred into Mox discharges e (an electron) and the electron moves through the photosensitizer 5 and the electron transport layer 1 to the first electrode 2 and then flows to the second electrode 3.

The electron transport layer 1 unfortunately includes the cavities 10 as described above. Hence, the electron introduced into the first electrode 2 can be directly discharged to the hole transport layer 4 packed in the cavities 10, and thus the electron may be used to oxidize Mox in the hole transport layer 4 to Mred. In other words, because of the undesired reaction of using electrons through the cavities 10 as paths, through which mediator diffuses, the photoelectric element A is difficult to have higher conversion efficiency.

The inventors of the present invention have studied in order to solve both the conventional problems and the problems obtained by our studies above and have completed the present invention.

Embodiments of the present invention will now be described with reference to FIG. 1 to FIG. 3.

Figure 2:
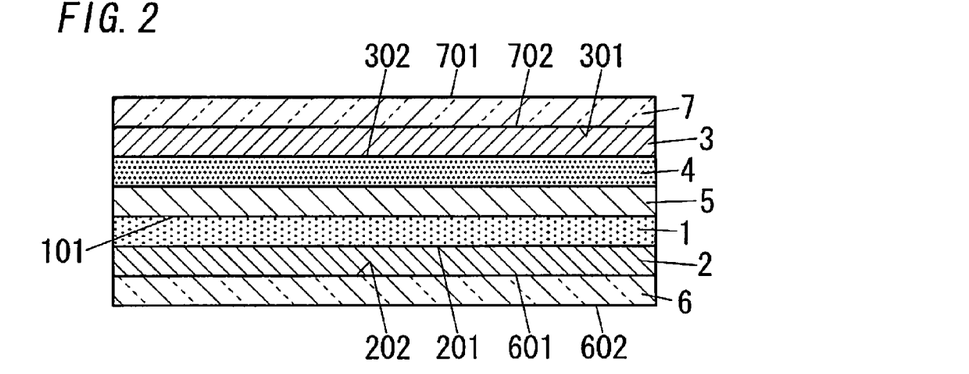
FIG. 2 is a schematic cross-sectional view of an embodiment of the photoelectric element of the present invention.

FIG. 2 shows an example of a photoelectric element A of the present invention. The photoelectric element A includes a pair of substrates 6 and 7 opposite to each other. One substrate 6 has an inside face with a first electrode 2, the other substrate 7 has an inside face with a second electrode 3, and the first electrode 2 is opposite to the second electrode 3.

In other words, the photoelectric element A of the present invention includes a first substrate 6 and a second substrate 7. The first substrate 6 and the second substrate 7 are a pair of substrates 6 and 7. In this case, the first substrate 6 has a first face 601 and a second face 602, and the second substrate 7 has a first face 701 and a second face 702. Accordingly, the first substrate 6 and the second substrate 7 are arranged so that the first face 601 on the first substrate 6 is opposite to the second face 702 on the second substrate 7. Hence, the first substrate 6 and the second substrate 7 are produced as a pair.

A first electrode 2 is provided on the first face 601 on the first substrate 6, and a second electrode 3 is provided on the second face 702 on the second substrate 7.

In this case, the first electrode 2 has a first face 201 and a second face 202, and the second electrode 3 has a first face 301 and a second face 302. Accordingly, the first electrode 2 and the second electrode 3 are arranged opposite to each other so that the first face 201 on the first electrode 2 is opposite to the second face on the second electrode 3.

The first face 601 on the first substrate 6 may be in contact with the second face 202 on the first electrode 2, or a fixing agent (not shown in the drawings) may be disposed between the first face 601 and the second face 202 so as to fix the first substrate 6 to the first electrode 2.

Examples of such a fixing agent include a liquid or solid adhesive, an insulating agent, and a locking member. The fixing agent is preferably made of an optically transparent material. To use a fixing agent, the first substrate 6 may be bonded and fixed to the first electrode 2 before the fixing agent hardens, or the fixing agent may be disposed between the first face 601 and the second face 202 followed by thermocompression to thus fix the first substrate 6 to the first electrode 2. In this case, the fixing agent preferably has a higher light transmittance than that of the first electrode 2.

This can prevent the fixing agent from absorbing light as much as possible even when the photoelectric element A is formed so that light enters from the second face of the first electrode 2.

On the face 702, which is opposite to the substrate 6, of the first electrode 2, an electron transport layer 1 including, for example, a semiconductor is provided, and between the substrates 6 and 7, a hole transport layer (charge transport layer) 4 is interposed.

In other words, on the first face 201 on the first electrode 2, the electron transport layer 1 is provided. The electron transport layer 1 includes, for example, a semiconductor. Between the first substrate 6 and the second substrate 7, the hole transport layer (charge transport layer) 4 is interposed. Such a hole transport layer 4 may include a semiconductor, for example.

Figure 1:
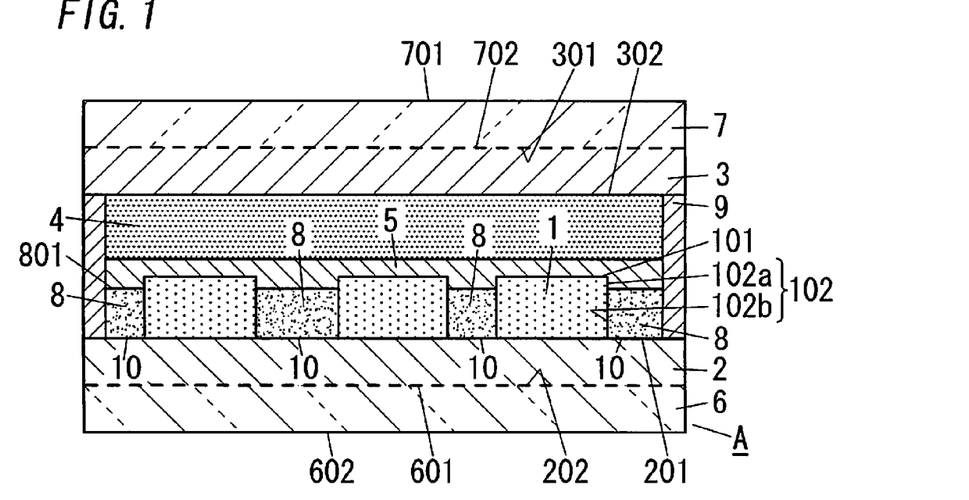
FIG. 1 is a schematic view showing an embodiment of a photoelectric element of the present invention.

FIG. 1 shows an example of the photoelectric element A of the present invention in detail. The first electrode 2 and the second electrode 3 are arranged opposite to and spaced a predetermined distance apart from each other. The space between the first electrode 2 and the second electrode 3 is sealed with a sealing member 9 and the sealed space is filled with the hole transport layer 4. The first electrode 2 has a face that is opposite to the second electrode 3 and on which the electron transport layer 1 including filled parts 8 is stacked. The electron transport layer 1 has a face opposite to the second electrode 3 and on the face (including a face that is on the filled part 8 and is opposite to the second electrode 3), a photosensitizer 5 is stacked as a layer and is supported.

In other words, the photoelectric element A of the present invention shown in FIG. 1 as an example includes the first electrode 2 and the second electrode 3. The first electrode 2 and the second electrode 3 are arranged opposite to each other so that the first face 201 on the first electrode 2 is spaced a predetermined distance apart from the second face 302 on the second electrode 3. The space (having a predetermined distance) between the first face 201 on the first electrode 2 and the second face 302 on the second electrode 3 is sealed with the sealing member 9. The sealed space is filled with the hole transport layer 4.

On the first face 201 on the first electrode 2, the electron transport layer 1 is provided, and the electron transport layer 1 includes the filled parts 8.

In this case, the electron transport layer 1 includes cavities 10 penetrating in the thickness direction of the electron transport layer 1, and the filled part 8 is preferably arranged in the cavity 10.

Of a pair of the substrates 6 and 7, the first substrate 6 with the first electrode 2 on which the electron transport layer 1 is provided may be made of an optically transparent glass or film or a metal processed so as to be optically transparent. For example, the metal preferably has a linear (stripe) pattern, a wavy line pattern, a lattice (mesh) pattern, a punching metal form, or a particle aggregate form from the viewpoint of economic advantages due to the reduction in material cost because light can pass through openings and no transparent conductive material is required. A substrate having such a form may be used in combination with a structural material such as plastic and glass from the viewpoint of durability of the element.

For an element in which the second substrate 7 disposed on the other side serves as the light incident substrate, the substrate 6 may be formed of an optically opaque material. In such a case, the first substrate 6 may be electrically conductive. That is, the substrate 6 is preferably made of an electrically conductive material so as to work as the first electrode 2.

Examples of such an electrically conductive material include materials such as carbon, aluminum, titanium, iron, nickel, copper, rhodium, indium, tin, zinc, platinum, and gold; and alloys containing at least one material of a linear (stripe) material, a wavy line material, a lattice (mesh) material, a metal foil material, a punching metal material, and a particle aggregate material that are made of a metal such as stainless steel. In the present invention, a radical compound is unlikely to corrode metals as compared with halogen ions and other substances as described later, and thus the substrates 6 and 7, the first electrode 2, and the second electrode 3 may employ commonly used metals.

The substrate 7 may be made of the same material as that for the substrate 6. The substrate 7 may be optically transparent or not and is preferably transparent because such a structure allows light to enter from both the substrates 6 and 7. In an element including the substrate 6 employing a metal foil as above, the substrate 7 is preferably made of an optically transparent material.

In this case, the second face 702 on the second substrate 7 may be in contact with the first face 301 on the second electrode 3, or an optically transparent fixing agent may be disposed between the second face 702 and the first face 301 so as to fix the second substrate 7 to the second electrode 3.

Examples of such an optically transparent fixing agent include a liquid or solid adhesive, an insulating agent, and a locking member. To use an optically transparent fixing agent, the second substrate 7 may be bonded and fixed to the second electrode 3 before the optically transparent fixing agent hardens, or the optically transparent fixing agent may be disposed between the second face 702 and the first face 301 followed by thermocompression to thus fix the second substrate 7 to the second electrode 3.

The first electrode 2 is formed as a film on the substrate 6 and serves as the negative electrode of the photoelectric element A. The first electrode 2 may be formed of a metal alone or may be formed by stacking a conductive material layer on a substrate or a film.

In other words, the first electrode 2 is formed as a film on the first substrate 6 and the first electrode 2 serves as the negative electrode of the photoelectric element A, for example. The first electrode 2 may be formed of a metal alone or the first electrode 2 may be formed by stacking a conductive material layer on a substrate or a film substrate.

Preferred examples of such a conductive material include metals such as platinum, gold, silver, copper, aluminum, rhodium, and indium; carbon; electrically conductive metal oxides such as an indium-tin composite oxide, antimony doped tin oxide, and fluorine doped tin oxide; and composite of the materials.

The present invention is achieved with a radical compound having high electron transfer rate. Thus, in order to suppress the leakage of electrons on the surface 201 of the first electrode 2, that is, in order to impart rectification, the first electrode 2 preferably includes a material having a coating including, for example, silicon oxide, tin oxide, titanium oxide, zirconium oxide, or aluminum oxide on the compound.

In other words, the photoelectric element A of the present invention is achieved with a radical compound having high electron transfer rate. Thus, the photoelectric element A is formed so as to suppress the leakage of electrons on the first face 201 of the first electrode 2. In this case, the first electrode 2 preferably includes a conductive material layer and a coating layer, and the coating layer preferably covers the conductive material layer. In order to impart electron rectification to the conductive material layer, the coating layer is preferably made of a material such as silicon oxide, tin oxide, titanium oxide, zirconium oxide, and aluminum oxide.

The first electrode 2 preferably has a lower surface resistance and the surface resistance range is preferably 200Ω/□ or less and more preferably 50Ω/□ or less. The lower limit of the surface resistance is not particularly limited and is typically 0.1Ω/□.

The first electrode 2 preferably has a higher light transmittance and the light transmittance range is preferably 50% or more and more preferably 80% or more. The first electrode 2 preferably has a film thickness ranging from 1 to 100 nm. A film thickness within the range enables the formation of the electrode film having a uniform film thickness, prevents light transmittance from reducing, and allows a sufficient amount of light to enter into the electron transport layer 1.

The second electrode 3 preferably has a lower surface resistance as with the first electrode 2 and the surface resistance range is preferably 200Ω/□ or less and more preferably 50Ω/□ or less. The lower limit of the surface resistance is not particularly limited and is typically 0.1Ω/□.

The second electrode 3 preferably has a higher light transmittance and the light transmittance range is preferably 50% or more and more preferably 80% or more. The second electrode 3 preferably has a film thickness ranging from 1 to 100 nm. A film thickness within the range enables the formation of the electrode film having a uniform film thickness, prevents light transmittance from reducing, and allows a sufficient amount of light to enter into the hole transport layer 4.

For an element including a transparent first electrode 2, light preferably enters from the first electrode 2 attaching the electron transport layer 1.

In other words, for the photoelectric element A of the present invention including a transparent first electrode 2, light preferably enters from the second face 202 of the first electrode 2 attaching the electron transport layer 1.

The second electrode 3 serves as the positive electrode of the photoelectric element A and can be formed in a similar manner to that for the first electrode 2. The second electrode 3 preferably employs a material having catalytic action to give electrons to a reduced form of an electrolyte used in the hole transport layer 4. This allows the second electrode 3 to efficiently work as the positive electrode of the photoelectric element A.

Examples of such a material include metals such as platinum, gold, silver, copper, aluminum, rhodium, and indium; carbon materials such as graphite, carbon nanotubes, and platinum supported on carbon; electrically conductive metal oxides such as an indium-tin composite oxide, antimony doped tin oxide, and fluorine doped tin oxide; and electrically conductive polymers such as polyethylenedioxythiophene, polypyrrole, and polyaniline. Among them, for example, platinum, graphite, and polyethylenedioxythiophene are particularly preferred.

The substrate 7 provided with the second electrode 3 may have a transparent conductive film (not shown in the drawings) on the face attaching the second electrode 3.

In other words, the second substrate 7 may have a transparent conductive film on the face (the first face 301 on the second electrode 3) attaching the second electrode 3. In this case, the second substrate 7 is present opposite to the first face 301 of the second electrode 3, and the transparent conductive film is interposed between the second face 702 on the second substrate 7 and the first face 301 on the second electrode 3.

The transparent conductive film may be formed as a film from any of the materials exemplified as those for the first electrode 2, for example.

That is, the transparent conductive film may be stacked on a substrate or a film substrate. The transparent conductive film includes a transparent electrically conductive material. Examples of the transparent electrically conductive material include electrically conductive metal oxides such as an indium-tin composite oxide, antimony doped tin oxide, and fluorine doped tin oxide and composites of them.

In this case, the second electrode 3 is preferably also transparent. For an element including the transparent second electrode 3, light may enter from the first face 301 on the second electrode 3 or from both the second face 202 on the first electrode 2 and the first face 301 on the second electrode 3.

This is because such a structure has a beneficial effect, for example, on the case having the possibility of light irradiation from both sides of the substrates 6 and 7 due to the effect of reflected light or other effects. The substrate 6 with the first electrode 2 and the substrate 7 with the second electrode 3 may be a transparent conductive substrate.

Examples of usable materials for the electron transport layer 1 include oxides of metallic elements such as Cd, Zn, In, Pb, Mo, W, Sb, Bi, Cu, Hg, Ti, Ag, Mn, Fe, V, Sn, Zr, Sr, Ga, Si, and Cr; perovskites such as $SrTiO_3$ and $CaTiO_3$; sulfides such as CdS, ZnS, $In_2S_3$, PbS, $Mo_2S$, $WS_2$, $Sb_2S_3$, $Bi_2S_3$, $ZnCdS_2$, and $Cu_2S$; metal chalcogenides such as CdSe, $In_2Se_3$, $WSe_2$, HgS, PbSe, and CdTe; and other materials such as GaAs, Si, Se, $Cd_2P_3$, $Zn_2P_3$, InP, AgBr, $PbI_2$, $HgI_2$, and $BiI_3$. Usable examples further include composites containing at least one selected from these semiconductor materials, such as $CdS/TiO_2$, CdS/AgI, $Ag_2S$/AgI, CdS/ZnO, CdS/HgS, CdS/PbS, ZnO/ZnS, ZnO/ZnSe, CdS/HgS, $CdS_x/CdSe_{1-x}$, $CdS_x/Te_{1-x}$, $CdSe_x/Te_{1-x}$, ZnS/CdSe, ZnSe/CdSe, CdS/ZnS, $TiO_2/Cd_3P_2$, $CdS/CdSeCd_yZn_{1-y}S$, and CdS/HgS/CdS. Other usable examples include organic semiconductors such as poly(phenylene vinylene), polythiophene, polyacetylene, tetracene, pentacene, and phthalocyanine.

The electron transport layer 1 may be an organic compound having an redox moiety capable of repeated oxidation-reduction as a part in the molecule and having, as another part, a moiety to form a gel by containing an electrolytic solution to be swollen.

In other words, the organic semiconductor may be an organic compound and the electron transport layer 1 may include the organic compound. In this case, the organic compound has an redox moiety capable of repeated oxidation-reduction and a gel moiety which can contains an electrolytic solution to be swollen, in the molecule.

The organic compound used in the electron transport layer 1 will now be specifically described. The organic compound has an redox moiety capable of repeated oxidation-reduction as a part in the molecule and has, as another part, a moiety (hereinafter called gel moiety) that form a gel by containing an electrolytic solution to be swollen. The redox moiety is chemically bonded to the gel moiety. The positional relation between the redox moiety and the gel moiety in the molecule is not particularly limited. For example, in a molecule having the gel moiety that constitutes a molecular framework such as a main chain, the redox moiety is a side chain that is bonded to the main chain. A molecular framework forming the gel moiety may be alternately bonded to a molecular framework forming the redox moiety.

The oxidation-reduction (oxidation-reduction reaction) means that an ion, an atom, or a compound donates and accepts electrons. The redox moiety is a site capable of stably donating and accepting electrons by oxidation-reduction reaction (redox reaction).

The organic compound has an redox moiety and is swollen with an electrolytic solution to form the electron transport layer 1. In other words, the organic compound in a gel state has a steric network structure and the network structure is filled with a liquid.

The organic compound having an redox moiety and a gel moiety may have a low molecular weight or a high molecular weight. A usable organic compound having a low molecular weight may be an organic compound that forms what is called a low molecular weight gel through, for example, a hydrogen bond. For the organic compound having a high molecular weight, an organic compound having a number average molecular weight of 1,000 or more is preferred because such an organic compound can exert spontaneous gel forming action. The upper limit of the molecular weight of the organic compound having a high molecular weight is not particularly limited and is preferably 1,000,000 or less. The gel preferably has, for example, a konjac jelly-like appearance or an ion exchange film-like appearance but the gel state is not necessarily to them.

The "redox moiety capable of repeated oxidation-reduction" means a moiety that is reversibly converted into an oxidized form and a reduced form by oxidation-reduction reaction. The redox moiety is preferably an oxidation-reduction component in which the oxidized form and the reduced form have the same charge.

The organic compound having an redox moiety and a gel moiety in the same molecule can be represented by the general formula below.

$(X_i)_n$ and $(X_i)_{nj}$ represent the gel moiety, $X_i$ represents a monomer of a compound constituting the gel moiety, and the gel moiety can be formed of a polymer framework. The degree n of polymerization of a monomer preferably ranges from 1 to 100,000. Y represents the redox moiety bonded to X. j and k are arbitrary integers representing the numbers of $(X_i)_n$ and Y in a molecule, respectively, and each preferably ranges from 1 to 100,000. The redox moiety Y may be bonded to any position in the polymer framework constituting the gel moietys $(X_i)_n$ and $(X_i)_{nj}$. The redox moiety Y may contain various materials, and the materials preferably have oxidation-reduction potentials, which are similar to each other, from the viewpoint of electron exchange reaction.

Examples of the organic compound having an redox moiety and a gel moiety in the same molecule and serving as the electron transport layer 1 include a polymer having a quinone derivative framework obtained by chemically bonded quinones, a polymer having an imide derivative framework containing imides, a polymer having a phenoxyl derivative framework containing phenoxyls, and a polymer having a viologen derivative framework containing viologens. In these organic compounds, each polymer framework serves as the gel moiety and each of the quinone derivative framework, the imide derivative framework, the phenoxyl derivative framework, and the viologen derivative framework serves as the redox moiety.

Among the organic compounds, examples of the polymer having a quinone derivative framework obtained by chemically bonded quinones include polymers having chemical structures of [Chemical Formula 5] to [Chemical Formula 8].

In [Chemical Formula 5] to [Chemical Formula 8], each of "R"s is saturated or unsaturated hydrocarbons such as methylene, ethylene, propane-1,3-dienyl, ethylidene, propane-2,2-diyl, alkanediyl, benzylidene, propylene, vinylidene, propene-1,3-diyl, and but-1-ene-1,4-diyl; cyclic hydrocarbons such as cyclohexanediyl, cyclohexenediyl, cyclohexadienediyl, phenylene, naphthalene, and biphenylene; keto and divalent acyl groups such as oxalyl, malonyl, succinyl, glutaryl, adipoyl, alkanedioyl, sebacoyl, fumaroyl, maleoyl, phthaloyl, isophthaloyl, and terephthaloyl; ethers and esters such as oxy, oxymethylenoxy, and oxycarbonyl; sulfur-containing groups such as sulfanediyl, sulfanil, and sulfonyl; nitrogen-containing groups such as imino, nitrilo, hydrazo, azo, azino, diazoamino, urylene, and amide; silicon-containing groups such as silanediyl and disilane-1,2-diyl; or groups formed by substituting the terminal thereof and composite groups thereof.

[Chemical Formula 5] is an example of the organic compound including a polymer main chain to which an anthraquinone is chemically bonded. [Chemical Formula 6] is an example of the organic compound including a polymer main chain into which an anthraquinone is integrated as a repeated unit. [Chemical Formula 7] is an example of the organic compound including an anthraquinone as a cross-linking unit. [Chemical Formula 8] is an example of the anthraquinone having a proton donating group that forms an intermolecular hydrogen bond together with an oxygen atom.

[Chemical Formula 5]

[Chemical Formula 6]

[Chemical Formula 7]

[Chemical Formula 8]

A polymer has a redox moiety Y that is an imide derivative framework, and the imide derivative framework includes an imide, and the polymer may be polyimides represented by

[Chemical Formula 9] and [Chemical Formula 10]. In [Chemical Formula 9] and [Chemical Formula 10], each of $R_1$ to $R_3$ is an aromatic group such as a phenylene group, an aliphatic chain such as an alkylene group and an alkyl ether, or an ether group. The polyimide polymer framework may be cross-linked at the sites of $R_1$ to $R_3$ and may have no cross-linked structure as long as the polyimide polymer framework is merely swollen and is not dissolved in a solvent used. In a cross-linked polymer, the cross-linked moiety corresponds to the gel moietys $(X_i)_n$ and $(X_i)_{nj}$. In a polyimide polymer framework with a cross-linked structure, the cross-linking unit may contain an imido group. A suitably used imido group is exemplified by phthalimide and pyromellitimide having electrochemically reversible oxidation-reduction properties.

[Chemical Formula 9]

[Chemical Formula 10]

Examples of the polymer having a phenoxyl derivative framework containing phenoxyls include a galvi compound (galvi polymer) as represented by [Chemical Formula 11]. In the galvi compound, the galvinoxyl group (see [Chemical Formula 12]) corresponds to the redox moiety Y, and the polymer framework corresponds to the gel moietys $(X_i)_n$ and $(X_i)_{nj}$.

[Chemical Formula 11]

[Chemical Formula 12]

Examples of the polymer having a viologen derivative framework containing viologens include polyviologen polymers as represented by [Chemical Formula 13] and [Chemical Formula 14]. In the polyviologen polymer, the moiety represented by [Chemical Formula 15] corresponds to the redox moiety Y, and the polymer framework corresponds to the gel moietys $(X_i)_n$ and $(X_i)_{nj}$.

[Chemical Formula 13]

[Chemical Formula 14]

[Chemical Formula 15]

In [Chemical Formula 5] to [Chemical Formula 7], [Chemical Formula 9] to [Chemical Formula 11], [Chemical Formula 13], and [Chemical Formula 14], each of "m" and "n"s is the degree of polymerization of a monomer and preferably range from 1 to 100,000.

As described above, the organic compound having an redox moiety and a polymer framework contains an electrolytic solution in a space in the polymer framework to be swollen and this causes the electron transport layer 1 to be gelated, thereby forming a gel layer. Containing an electrolytic solution in a polymer framework in this manner compensates an ionic state formed by oxidation-reduction reaction of the redox moiety with a counter ion in the electrolytic solution, thereby stabilizing the redox moiety. Examples of the electrolytic solution include electrolytic solutions included in the hole transport layer 4 described later.

Among the electron transport layers 1, $TiO_2$ and the organic compound having an redox moiety and a gel moiety in the same molecule are preferred because such a compound can avoid photodissolution in an electrolytic solution included in the hole transport layer 4 and can achieve high photoelectric conversion characteristics.

The electron transport layer 1 formed on the surface 201 of the first electrode 2 preferably has a thickness ranging from 0.01 to 100 µm. A film thickness within the range can achieve sufficient photovoltaic conversion effect and can eliminate the possibility of lowering the transmittance of visible light and near infrared light. The electron transport layer 1 more preferably has a thickness ranging from 0.5 to 50 μm and particularly preferably ranging from 1 to 20 μm.

For the electron transport layer 1 including an inorganic compound, the electron transport layer 1 can be formed by applying a mixed solution of a semiconductor and a binder onto a surface of the first electrode 2 by a known method such as coating with, for example, a doctor blade or a bar coater, spraying, dip coating, screen printing, and spin coating and then removing the binder component by heat burning, pressurization with a press machine, or other means.

The electron transport layer 1 including an inorganic compound preferably has a surface roughness of 10 or more in terms of effective area/projected area. A surface roughness of 10 or more can increase the surface area of a charge separation interface, thereby improving the photoelectric conversion characteristics. The surface roughness is more preferably 100 to 2,000.

The electron transport layer 1 including an organic compound is preferably formed by a wet formation method of applying, for example, a solution because such a formation method is simpler and inexpensive. Especially for an electron transport layer 1 including what is called a high molecular weight organic compound having a number average molecular weight of 1,000 or more, the wet formation method is preferred from the viewpoint of formability. Examples of the wet process include spin coating, drop casting in which a liquid is dropped and dried, and printing such as screen printing and gravure printing. In addition, vacuum processes such as sputtering and depositing can be employed.

The electron transport layer 1 formed as described above may include the cavities 10 as above. In the present embodiment, a filled part 8 is formed in order to fill and close the cavity 10. In the filled part 8, an organic molecule is packed in the cavity 10 to be included in the electron transport layer 1.

The organic molecule included in the filled part 8 preferably contains a molecule (compound) obtained by electropolymerization of a precursor having two or more moieties represented by [Chemical Formula 1] per molecule. This prevents the first electrode 2 from coming in contact with a mediator in the hole transport layer 4 to thus improve the open circuit voltage, thereby improving the conversion efficiency.

The organic compound obtained in this manner has a bipyridinium structural unit represented by [Chemical Formula 16] as the redox moiety.

The bipyridinium structural unit is formed by electropolymerization in which the substituent represented by X is eliminated from a moiety having the structure represented by [Chemical Formula 1] in the precursor and the precursors are bonded to each other at the position from which the substituent represented by X is eliminated.

Reducing the bipyridinium structure by an electron forms a pyridinium cation radical, and further reducing the radical by another electron forms a pyridinium diradical. Conversely, oxidizing the pyridinium diradical by an electron forms the pyridinium cation radical, and further oxidizing the pyridinium cation radical by another electron forms the original pyridinium structural unit.

The organic compound accordingly has stable repeated oxidation-reduction ability. The organic compound, which passes through radical states during oxidation-reduction, causes very rapid self-electron exchange reaction, and thus electrons are easily accepted and donated between the organic compounds. The radical state of an organic compound during oxidation-reduction can be observed by electron spin resonance (ESR), for example.

[Chemical Formula 16]

Examples of the counter anion $A^-$ in the moiety represented by [Chemical Formula 16] include at least one anion selected from the group consisting of a bromide ion, a chloride ion, a perchlorate ion, a hexafluorophosphate ion, and a tetrafluoroborate ion. This prevents the first electrode 2 from coming in contact with a mediator in the hole transport layer 4 to thus improve the open circuit voltage, thereby efficiency improving the conversion efficiency.

More specifically, the precursor of the organic molecule included in the filled part 8 preferably has two moieties represented by [Chemical Formula 1], and the organic molecule is preferably a straight-chain polymer obtained from the precursor. This allows the polymer to effectively fill a cavity 10 having a small pore size to thus improve the open circuit voltage, thereby efficiency improving the conversion efficiency.

A precursor consisting of the compound containing two moieties having the structure represented by [Chemical Formula 1] alone yields an organic molecule having a straight chain. For example, a precursor consisting of the compound represented by [Chemical Formula 17] yields an organic compound having a straight-chain molecular structure represented by [Chemical Formula 2], and a precursor consisting of the compound represented by [Chemical Formula 18] yields an organic molecule having a straight-chain molecular structure represented by [Chemical Formula 3].

[Chemical Formula 17]

[Chemical Formula 18]

The straight-chain polymer organic molecule preferably has the repeating unit of [Chemical Formula 2] or [Chemical Formula 3]. Accordingly, the cavities 10 in the electron transport layer 1 are effectively filled with the polymer including the organic compound as the filled part 8. This prevents the first electrode 2 from coming in contact with a mediator in the hole transport layer 4 to thus improve the open circuit voltage, thereby efficiency improving the conversion efficiency.

The precursor of the organic molecule included in the filled part 8 preferably has three or more moieties represented by [Chemical Formula 1] and the organic molecule is preferably a three-dimensional cross-linked polymer obtained from the precursor. Accordingly, the cavities 10 in the electron transport layer 1 are effectively filled with the polymer including the organic compound as the filled part 8. This prevents the first electrode 2 from coming in contact with a mediator in the hole transport layer 4 to thus improve the open circuit voltage, thereby efficiency improving the conversion efficiency.

A precursor including the compound containing three or more moieties having the structure represented by [Chemical Formula 1] as at least some components yields a cross-linked polymer organic molecule. For example, a precursor including the compound represented by [Chemical Formula 19] yields an organic molecule represented by [Chemical Formula 4].

[Chemical Formula 19]

The cross-linked polymer organic molecule more preferably has the repeating unit of [Chemical Formula 4]. Accordingly, the cavities 10 in the electron transport layer 1 are effectively filled with the polymer including the organic compound as the filled part 8. This prevents the first electrode 2 from coming in contact with a mediator in the hole transport layer 4 to thus improve the open circuit voltage, thereby efficiency improving the conversion efficiency.

For electropolymerization of the organic compound, for example, a first electrode 2 with an electron transport layer 1 and a counter electrode are immersed in a liquid (solution) containing a precursor. In this condition, applying voltage between the first electrode 2 and the counter electrode causes electrochemical reaction to polymerize the precursor on the first face 201 of the first electrode 2. This precipitates the polymerized organic compound. In this case, applying an electric potential lower than a reduction potential of the precursor to the first electrode 2 allows the polymerized organic compound to be precipitated on the surface 201 of the first electrode 2.

The electropolymerization requires no advanced equipment or technology that are required for chemical vapor deposition (CVD) but achieves high precipitation speed of an organic compound. In addition, the precipitated organic molecule is unlikely to be removed from the first electrode 2, and the organic molecule easily obtains a compact structure and a thin film structure.

Formation of the filled parts 8 in the cavities 10 in the electron transport layer 1 as described above makes the organic molecule dense and the redox moiety is closely arranged. On this account, the electron transport layer 1 has high electron transport properties.

Three-dimensional expansion of the organic compound included in the electron transport layer 1 increases the stability of the organic compound. In addition, the organic compound obtains a lower solubility in a solvent, and thus the electrolytic solution can contain more various solvents. Moreover, the electropolymerization increases the molecular weight of an organic compound to be obtained, and hence the filled part 8 formed by the electropolymerization of a precursor accordingly has high durability.

The filled part 8 preferably has a thickness equal to or a little smaller than the thickness of the electron transport layer 1. This is because that such a thickness sufficiently gives the blocking effect (filling effect) in the cavity 10 and prevents the transmittance of visible light and near infrared light from reducing.

On the surface 101 (including the surface 801 of the filled part 8) of the electron transport layer 1 formed as above, a photosensitizer 5 is supported. In such a structure, the photosensitizer 5 forms the interface for photocharge separation, thereby improving the photovoltaic conversion efficiency.

Such a photosensitizer 5 may be known materials including both inorganic materials such as semiconductor ultrafine particles and organic materials such as a dye and a pigment.

The photosensitizer 5 in the present invention is preferably a dye efficiently absorbing light and separating charges. Examples of such a dye include a 9-phenylxanthene dye, a coumarin dye, an acridine dye, a triphenylmethane dye, a tetraphenylmethane dye, a quinone dye, an azo dye, an indigo dye, a cyanine dye, a merocyanine dye, and a xanthene dye. Additional examples include a $RuL_2(H_2O)_2$ type ruthenium-cis-diaqua-bipyridyl complex (where L is 4,4'-dicarboxyl-2,2'-bipyridine), transition-metal complexes such as ruthenium-tris ($RuL_3$), ruthenium-bis ($RuL_2$), osmium-tris ($OsL_3$), and osmium-bis ($OsL_2$), zinc-tetra(4-carboxyphenyl)porphyrin, an iron-hexacyanide complex, and phthalocyanine.

Other applicable examples include dyes described in the chapter, DSSC, in "Advanced technology and Material Development of FPD, DSSC, Optical Memory, and Functional Dye" (NTS Inc.).

Among them, a dye capable of association on the electron transport layer 1 is preferably closely packed to cover the surface 101 of the electron transport layer 1. This is because such a dye serves as an insulator layer between the electron transport layer 1 and the hole transport layer 4.

A photosensitizer 5 serving as the insulator layer can impart rectification to generated electrons at a charge separation interface and thus can suppress the recombination of charges after charge separation. Such a photosensitizer can greatly reduce the number of recombination points for electrons and holes present in the electron transport material and the hole transport material. This can further improve the conversion efficiency of the photoelectric element to be obtained.

The dye forming association and having the effect is preferably a dye having the structure represented by [Chemical Formula 20] and specifically preferably a dye having the structure represented by [Chemical Formula 21]. The association can be verified from the absorption spectrum shapes of a dye dissolved in an organic solvent or other mediums and a dye supported on the electron transport layer 1. It is known that association largely changes the spectrum shape from a dye in the former state to that in the latter state.

[Chemical Formula 20]

In the formula, each of $X_1$ and $X_2$ includes at least one of an alkyl group, an alkenyl group, an aralkyl group, an aryl group, and a hetero ring, each optionally having a substituent. $X_2$ has a site to adsorb a semiconductor, such as a carboxyl group, a sulfonyl group, and a phosphonyl group.

[Chemical Formula 21]

Examples of the semiconductor ultrafine particles usable as the photosensitizer 5 include sulfide semiconductors such as cadmium sulfide, lead sulfide, and silver sulfide. The semiconductor ultrafine particles may have any particle size as long as such particles have photosensitization effect on the electron transport layer 1 of the present invention and preferably have a particle size ranging from 1 to 10 nm.

Examples of the method of supporting the photosensitizer 5 on the electron transport layer 1 including the filled parts 8 include a method of immersing the substrate 6 with the first electrode 2 attaching the electron transport layer 1 in a solution dissolving or dispersing the photosensitizer 5. The solution may contain any solvent capable of dissolving the photosensitizer 5, such as water, an alcohol, toluene, and dimethylformamide. During immersing the substrate 6 in a photosensitizer solution for a predetermined period of time, the solution may be heated and refluxed or be sonicated. After the photosensitizer 5 is supported, the substrate is desirably washed or heated and refluxed with an alcohol in order to remove an unsupported, remaining photosensitizer 5.

The amount of the photosensitizer 5 supported on the electron transport layer 1 may range from $1 \times 10^{-10}$ to $1 \times 10^{-4}$ mol/cm$^2$ and particularly preferably ranges from $0.1 \times 10^{-8}$ to $9.0 \times 10^{-6}$ mol/cm$^2$. This is because the photosensitizer 5 in an amount within the range can economically and sufficiently improve the photovoltaic conversion efficiency.

The hole transport layer 4 may include an electrolyte. The electrolyte included in the hole transport layer 4 is one or both of a supporting salt and a pair of oxidation-reduction components including an oxidized form and a reduced form.

Examples of the supporting salt (supporting electrolyte) include ammonium salts such as tetrabutylammonium perchlorate and tetraethylammonium hexafluorophosphate, imidazolium salts, pyridinium salts, and alkali metal salts such as lithium perchlorate and potassium tetrafluoroborate.

The oxidation-reduction component means a pair of substances reversibly converted into an oxidized form and a reduced form by oxidation-reduction reaction.

Examples of such an oxidation-reduction component include, but are not limited to, a chlorine compound/chlorine, an iodine compound/iodine, a bromine compound/bromine, a thallium ion (III)/a thallium ion (I), a mercury ion (II)/a mercury ion (I), a ruthenium ion (III)/a ruthenium ion (II), a copper ion (II)/a copper ion (I), an iron ion (III)/an iron ion (II), a nickel ion (II)/a nickel ion (III), a vanadium ion (III)/a vanadium ion (II), and a manganate ion/a permanganate ion. In this case, the oxidation-reduction component serves independent of the redox moiety of an organic compound included in the electron transport layer 1. The electrolytic solution may be in a gel form or in an immobilized form.

The solvent used for dissolving an electrolyte included in the hole transport layer 4 is preferably a compound that dissolves an oxidation-reduction component and has excellent ionic conductivity. The solvent to be used may be an aqueous solvent or an organic solvent and is preferably an organic solvent in order to further stabilize the component.

Examples of such an organic solvent include carbonate compounds such as dimethyl carbonate, diethyl carbonate, methyl ethyl carbonate, ethylene carbonate, and propylene carbonate; ester compounds such as methyl acetate, methyl propionate, and γ-butyrolactone; ether compounds such as diethyl ether, 1,2-dimethoxyethane, 1,3-dioxolane, tetrahydrofuran, and 2-methyltetrahydrofuran; heterocyclic compounds such as 3-methyl-2-oxazolidinone and 2-methylpyrrolidone; nitrile compounds such as acetonitrile, methoxyacetonitrile, and propionitrile; and aprotic polar compounds such as sulfolane, dimethylsulfoxide, and dimethylformamide. These solvents may be used singly or in combination as a mixture of two or more of them.

Among them, carbonate compounds such as ethylene carbonate and propylene carbonate; heterocyclic compounds such as γ-butyrolactone, 3-methyl-2-oxazolidinone, and 2-methylpyrrolidone; and nitrile compounds such as acetonitrile, methoxyacetonitrile, propionitrile, 3-methoxypropionitrile, and valeronitrile are preferred.

It is effective in providing nonvolatility and flame retardancy that the hole transport layer 4 includes an ionic liquid.

In such a case, examples of the ionic liquid include known, general ionic liquids such as an imidazolium ionic liquid, a pyridine ionic liquid, an alicyclic amine ionic liquid, an aliphatic amine ionic liquid, an azonium amine ionic liquid, and ionic liquids having structures described in European Patent No. 718288, specification; International Publication WO 95/18456, pamphlet; Denkikagaku, Vol. 65, No. 11, p. 923 (1997); J. Electrochem. Soc., Vol. 143, No. 10, p. 3099 (1996); and Inorg. Chem., Vol. 35, p. 1168 (1996).

The hole transport layer 4 can also include a gel electrolyte or a polymer electrolyte.

Examples of a gelling agent include a polymer, a gelling agent by polymer cross-linking reaction or other techniques, a gelling agent including a polymerizable multifunctional monomer, and an oil gelling agent.

The gel electrolyte or the polymer electrolyte may be a commonly used electrolyte. Preferred examples of the gel electrolyte and the polymer electrolyte in the present invention include vinylidene fluoride polymers such as polyvinylidene fluoride, acrylic acid polymers such as polyacrylic acid, acrylonitrile polymers such as polyacrylonitrile, and polyether polymers such as polyethylene oxide. The gel electrolyte or the polymer electrolyte in the present invention is also preferably a compound having an amide structure in the molecular structure.

In the photoelectric element A produced as above, applying light to the electron transport layer 1 causes the electron transport layer 1 to generate electrons or holes, and the electrons or holes participate in the oxidation-reduction reaction of a mediator in the hole transport layer 4. Here, the mediator means the oxidation-reduction component exemplified above.

The mediator in the hole transport layer 4 is a redox couple that is electrochemically oxidized or reduced. Current generated during the reaction can be extracted to the outside from the photoelectric element A through the first electrode 2 as the negative electrode and through the second electrode 3 as the positive electrode.

In the photoelectric element A, the filled parts 8 fill the cavities 10 included in the electron transport layer 1. This prevents the cavity 10 from becoming a path through which a mediator diffuses in the hole transport layer 4. Accordingly, the open circuit voltage is unlikely to be reduced, thereby achieving excellent conversion efficiency.

In other words, the reaction of a mediator in the hole transport layer 4 is shown by Mox+e$\leftrightarrow$Mred. Here, "Mox" is an oxidized form, "e" is an electron, "Mred" is a reduced form, and "$\leftrightarrow$" is an oxidation-reduction reaction.

Figure 3:
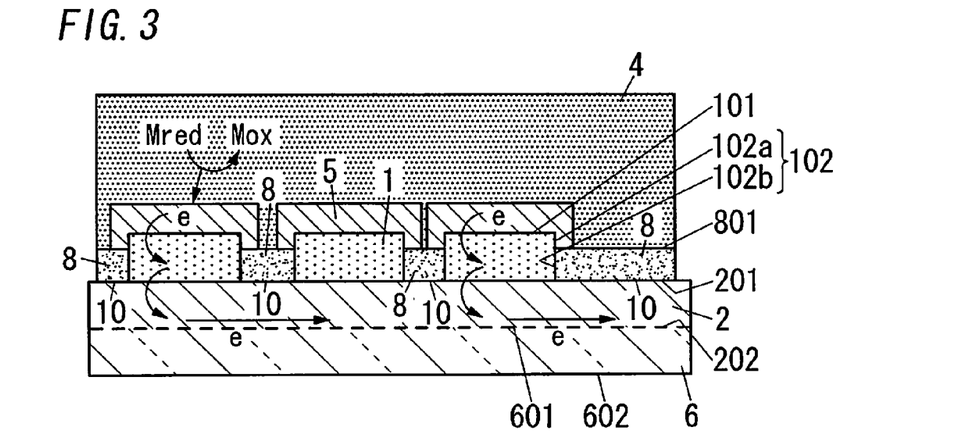
FIG. 3 is a schematic view showing an exemplified movement in an embodiment of the photoelectric element of the present invention.

In the photoelectric element A of the present invention, as shown in FIG. 3, reduction of Mred into Mox discharges e (an electron) and the electron moves through the photosensitizer 5 and the electron transport layer 1 to the first electrode 2 and then flows to the second electrode 3.

The cavities 10 in the electron transport layer 1 are filled with the filled parts 8 and thus the filled part 8 can block the transfer of the e (electron) introduced into the first electrode 2 to the hole transport layer 4 through the cavities 10. Accordingly, the filled part 8 prevents direct emission of the e (electron) introduced into the first electrode 2 to the hole transport layer 4.

Hence, consumption of the e (electron) introduced into the first electrode 2 for oxidizing Mox in the hole transport layer 4 to Mred is prevented, thereby achieving excellent conversion efficiency.

EXAMPLES

The present invention will be specifically described with reference to examples next.

Example 1

Synthesis of Galvi Monomer

Into a reaction container, 4-bromo-2,6-di-tert-butylphenol (135.8 g; 0.476 mol) and acetonitrile (270 ml) were charged, and in an inert atmosphere, N,O-bis(trimethylsilyl)acetamide (BSA) (106.3 g; 129.6 ml) was further added. The whole was stirred and reacted overnight at 70° C. until a crystal was completely precipitated. The precipitated white crystal was filtered, then was dried under vacuum, and was purified by recrystallization in ethanol, thereby yielding (4-bromo-2,6-di-tert-butylphenoxy)trimethylsilane (150.0 g; 0.420 mol) represented by sign "1" in [Chemical Formula 22] as a white plate crystal.

Next, in a reaction container, (4-bromo-2,6-di-tert-butylphenoxy)trimethylsilane (9.83 g; 0.0275 mol) obtained above was dissolved in tetrahydrofuran (200 ml) in an inert atmosphere and the prepared solution was cooled to −78° C. using dry ice/methanol. To the solution in the reaction container, a hexane solution of 1.58 M n-butyllithium (15.8 ml; 0.025 mol) was added and the whole was stirred at a temperature of 78° C. for 30 minutes for lithiation. Then, to the solution, a tetrahydrofuran solution (75 ml) of methyl 4-bromobenzoate (1.08 g; 0.005 mol, Mw: 215.0, TCI) was added and the whole was stirred from −78° C. to room temperature overnight. This changed the solution color from yellow through pale yellow to dark blue that suggested the generation of an anion. After the reaction, to the solution in the reaction container, a saturated aqueous ammonium chloride solution was added until the solution color was completely changed to yellow, and then the solution was extracted with ether/water, thereby yielding a product in a yellow viscous liquid form.

Then, into a reaction container, the product, THF (10 ml), methanol (7.5 ml), and a stirring bar were charged, and the product was dissolved. Next, 10 N HCl (1 to 2 ml) was gradually added until the reaction solution was changed to red-orange and the mixture was stirred for 30 minutes at room temperature. Then, the solvents were removed, and the residue was subjected to extraction with ether/water, solvent removal, fractionation by column chromatography (hexane/chloroform=1/1), and recrystallization in hexane to be purified, thereby yielding (p-bromophenyl)hydrogalvinoxyl (2.86 g; 0.0049 mol) represented by sign "2" in [Chemical Formula 23] as an orange crystal.

Next, in a reaction container, (p-bromophenyl)hydrogalvinoxyl (2.50 g; 4.33 mmol) obtained above was dissolved in toluene (21.6 ml; 0.2 M) in an inert atmosphere. To the solution, 2,6-di-tert-butyl-p-cresol (4.76 mg; 0.0216 mmol), tetrakis(triphenylphosphine)palladium(0) (0.150 g; 0.130 mmol), and tri-n-butylvinyltin (1.65 g; 5.20 mmol, Mw: 317.1, TCI) were immediately added, and the mixture was heated and stirred at 100° C. for 17 hours.

The reaction product obtained above was extracted with ether/water, and the solvent was removed. The residue was fractionated by flash column chromatography (hexane/chloroform=1/3) and was further purified by recrystallization in hexane, thereby yielding p-hydrogalvinoxylstyrene (1.54 g; 2.93 mmol) represented by sign "3" in [Chemical Formula 23] as an orange microcrystal.

Polymerization of Galvi Monomer

In 2 ml of tetrahydrofuran, 1 g of the galvi monomer (p-hydrogalvinoxylstyrene) obtained in Synthesis of Galvi Monomer above, 57.7 mg of tetraethylene glycol diacrylate, and 15.1 mg of azobisisobutyronitrile were dissolved. Then, the solution was subjected to nitrogen substitution and was refluxed overnight, thereby polymerizing the galvi monomer to yield a galvi polymer represented by sign "4" in [Chemical Formula 22].

Formation of Electron Transport Layer

An electrically conductive glass substrate having a thickness of 0.7 mm and a sheet resistance of 100Ω/□ was prepared as the substrate with a first electrode. The electrically conductive glass substrate includes a glass substrate and a coating film including fluorine doped $SnO_2$ stacked on a face of the glass substrate. The glass substrate serves as the substrate, and the coating film serves as the first electrode.

The galvi polymer (represented by sign "4" in [Chemical Formula 22]) was dissolved in chlorobenzene at a ratio of 1% by mass. The solution was applied onto the first electrode in the electrically conductive glass substrate by spin coating at 2,000 rpm and was dried at 60° C. and 0.01 MPa for 1 hour, thereby forming an electron transport layer having a thickness of 30 nm.

[Chemical Formula 22]

Electropolymerization Treatment to First Electrode with Electron Transport Layer A polyviologen precursor having the moiety represented by [Chemical Formula 1] was synthesized by Menschutkin reaction. In acetonitrile, 4-cyanopyridine and 1,3,5-(bromomethyl)-mesitylene were dissolved and the solution was refluxed overnight in an inert atmosphere. After the completion of the reaction, the product was purified by recrystallization in methanol to yield a polyviologen precursor ([Chemical Formula 23] shows the scheme). Next, in an aqueous solution of 0.02 M the obtained compound (Z1) and 0.1 M sodium iodide, the first electrode (FTO electrode) with the electron transport layer (galvi film) was immersed, and a constant voltage of −0.75 V was applied to the first electrode (FTO electrode) for 10 seconds. The obtained film was further subjected to terminal modification in an aqueous solution of 0.02 M 4-cyano-1-methyl-pyridinium salt and 0.1 M NaCl, thereby forming a galvi film on the first electrode with the electron transport layer. The galvi film formed is the filled part in the first electrode.

Dye Supporting Treatment

Next, onto the electron transport layer with the filled part formed as above, a saturated solution of D131 dye represented by [Chemical Formula 24] in acetonitrile was applied by spin coating, thereby stacking the photosensitizer (dye) on the surface of the electron transport layer.

[Chemical Formula 23]

-continued

[Chemical Formula 24]

Production of Second Electrode

Separately, an electrically conductive glass substrate (manufactured by Asahi Glass, 10Ω/□) having a surface with fluorine doped $SnO_2$ and having a thickness of 1 mm was used, and on the surface of $SnO_2$, platinum was applied by sputtering to yield a second electrode.

Bonding

Then, so as to surround the area in which the second electrode was formed, a hot-melt adhesive ("Bynel" manufactured by DUPONT-MITSUI POLYCHEMICALS CO., LTD.) as a sealer was disposed on the electrically conductive glass substrate. On the sealer, the glass substrate with the first electrode was stacked and the whole was pressurized and heated to be bonded to each other. The glass substrate with the second electrode had a hole formed with a diamond drill.

Electrolytic Solution Pouring

Next, 0.5 M OH-TEMPO and 0.5 mol/l potassium chloride were dissolved in water, thus preparing an electrolytic solution. The electrolytic solution was poured through the hole formed in the glass substrate and with a diamond drill, then the hole was sealed with an ultraviolet hardening resin, and a hole transport layer was consequently formed.

Evaluation of Photoelectric Element

The photoelectric conversion element produced in Example 1 was irradiated with light at 200 lux with a fluorescent light ("FLR20S•W/M" manufactured by Panasonic). The open circuit voltage (OCP) was 800 mV in the irradiation condition. Blocking light gradually reduced the OPC to 0 mV, and reirradiation of light increased the OCP to 800 mV. The photoresponse behavior was repeatedly, stably observed.

By chronoamperometry (CA measurement) with application at 50 mV, a photovoltaic current of about 2.4 µA/cm² was observed by the photoirradiation at 200 lux with a fluorescent light ("FLR20S•W/M" manufactured by Panasonic). Blocking light gradually reduced the photovoltaic current to 0 A/cm², and reirradiation of light increased the photovoltaic current to about 2.4 µA/cm². The photovoltaic current was repeatedly (40 cycles), stably observed.

Example 2

A photoelectric conversion element was produced in a similar manner to that in Example 1 except that electropolymerization was performed by immersing the first electrode (FTO electrode) with the electron transport layer (galvi film) in an aqueous solution of 0.02 M the compound (Z1) and 0.1 M sodium iodide and applying a constant voltage of −0.75 V to the first electrode (FTO electrode) for 5 minutes.

The photoelectric conversion element produced in Example 2 was irradiated with light at 200 lux with a fluorescent light ("FLR20S•W/M" manufactured by Panasonic). The open circuit voltage (OCP) was 900 mV in the irradiation condition. Blocking light gradually reduced the OPC to 0 mV, and reirradiation of light increased the OCP to 900 mV. The photoresponse behavior was repeatedly, stably observed.

By chronoamperometry (CA measurement) with application at 50 mV, a photovoltaic current of about 2.34 µA/cm² was observed by the photoirradiation at 200 lux with a fluorescent light ("FLR20S•W/M" manufactured by Panasonic). Blocking light gradually reduced the photovoltaic current to 0 A/cm², and reirradiation of light increased the photovoltaic current to about 2.34 µA/cm². The photovoltaic current was repeatedly (40 cycles), stably observed.

Comparative Example 1

A photoelectric element was produced in a similar manner to that in Example 1 except that no electropolymerization was performed ("without treatment" of "applying a constant voltage to 0.02 M the compound (Z1)").

The photoelectric conversion element produced in Comparative Example 1 was irradiated with light at 200 lux with a fluorescent light ("FLR20S•W/M" manufactured by Panasonic). The open circuit voltage (OCP) was 566 mV in the irradiation condition. Blocking light gradually reduced the OPC to 0 mV, and reirradiation of light increased the OCP to 566 mV. The photoresponse behavior was repeatedly, stably observed.

By chronoamperometry (CA measurement) with application at 50 mV, a photovoltaic current of about 2.30 µA/cm² was observed by the photoirradiation at 200 lux with a fluorescent light ("FLR20S•W/M" manufactured by Panasonic). Blocking light gradually reduced the photovoltaic current to 0 A/cm², and reirradiation of light increased the photovoltaic current to about 2.30 µA/cm². The photovoltaic current was repeatedly (40 cycles), stably observed.

TABLE 1

|  | Electron transport layer | Photosensitizer (dye) | Organic molecule in filled part | Time for electropolymerization | Open circuit voltage Voc (mV) | Short circuit current Jsc (µA/cm²) | Maximum output Pmax (µW/cm²) |
|---|---|---|---|---|---|---|---|
| Example 1 | Galvinoxyl radical polymer | D131 | Viologen monomer | 10 minutes | 800 | 2.40 | 0.600 |
| Example 2 | Galvinoxyl radical polymer | D131 | Viologen monomer | 5 minutes | 900 | 2.34 | 0.55 |

TABLE 1-continued

|  | Electron transport layer | Photosensitizer (dye) | Organic molecule in filled part | Time for electropolymerization | Open circuit voltage Voc (mV) | Short circuit current Jsc (μA/cm²) | Maximum output Pmax (μW/cm²) |
|---|---|---|---|---|---|---|---|
| Comparable Example 1 | Galvinoxyl radical polymer | D131 | Without | Without | 566 | 2.30 | 0.37 |

The invention claimed is:

1. A photoelectric element comprising:
a first electrode; a second electrode arranged opposite to the first electrode; an electron transport layer provided on a face of the first electrode, the face being opposite to the second electrode; a photosensitizer supported on the electron transport layer; and a hole transport layer interposed between the first electrode and the second electrode,
wherein the electron transport layer includes a filled part containing an organic molecule, and
the organic molecule contains a molecule obtained by electropolymerization of a precursor having two or more moieties represented by [Chemical Formula 1] per molecule:

[Chemical Formula 1]

X is an electropolymerizable functional group representing any of a cyano group, a fluoro group, a chloro group, and a bromo group.

2. The photoelectric element according to claim 1, wherein the precursor has two moieties represented by [Chemical Formula 1] and the organic molecule is a straight-chain polymer.

3. A photoelectric element comprising:
a first electrode; a second electrode arranged opposite to the first electrode; an electron transport layer provided on a face of the first electrode, the face being opposite to the second electrode; a photosensitizer supported on the electron transport layer; and a hole transport layer interposed between the first electrode and the second electrode,
wherein the electron transport layer includes a filled part containing an organic molecule, and
the organic molecule is a polymer having a repeating unit of [Chemical Formula 2] or a repeating unit of [Chemical Formula 3]

[Chemical Formula 2]

[Chemical Formula 3]

4. The photoelectric element according to claim 1, wherein the precursor has three or more moieties represented by [Chemical Formula 1] and the organic molecule is a crosslinked polymer.

5. A photoelectric element comprising:
a first electrode; a second electrode arranged opposite to the first electrode; an electron transport layer provided on a face of the first electrode, the face being opposite to the second electrode; a photosensitizer supported on the electron transport layer; and a hole transport layer interposed between the first electrode and the second electrode,
wherein the electron transport layer includes a filled part containing an organic molecule, and
the organic molecule is a polymer having a repeating unit of [Chemical Formula 4]

[Chemical Formula 4]

6. The photoelectric element according to claim 1, wherein the precursor has at least one counter anion selected from the group consisting of a bromide ion, a chloride ion, a perchlorate ion, a hexafluorophosphate ion, and a tetrafluoroborate ion.

7. A method for producing a photoelectric element including a first electrode, a second electrode arranged opposite to the first electrode, an electron transport layer provided on a face of the first electrode, the face being opposed to the second electrode, a photosensitizer supported on the electron transport layer, and a hole transport layer interposed between the first electrode and the second electrode, the method comprising:
- immersing the first electrode with the electron transport layer in a liquid containing a precursor; and
- applying an electric potential lower than a reduction potential of the precursor to the first electrode to precipitate an organic molecule as a film on a surface of the first electrode, thereby allowing the electron transport layer to include the organic molecule as a filled part.

8. The photoelectric element according to claim 1, wherein the electron transport layer has a cavity penetrating in the thickness direction of the electron transport layer and the filled part is arranged in the cavity.

9. The photoelectric element according to claim 3, wherein the electron transport layer has a cavity penetrating in the thickness direction of the electron transport layer and the filled part is arranged in the cavity.

10. The photoelectric element according to claim 5, wherein the electron transport layer has a cavity penetrating in the thickness direction of the electron transport layer and the filled part is arranged in the cavity.

* * * * *